United States Patent

Craft

[15] 3,701,022

[45] Oct. 24, 1972

[54] PEAK-TO-PEAK DETECTOR

[72] Inventor: Jack Craft, Somerville, N.J.

[73] Assignee: RCA Corporation

[22] Filed: June 8, 1971

[21] Appl. No.: 151,115

[52] U.S. Cl. ......................325/318, 321/15, 324/119

[51] Int. Cl. .......G01r 19/04, H02m 7/24, H04b 1/16

[58] Field of Search ..........325/318; 321/15; 324/119

[56] References Cited

UNITED STATES PATENTS

| | | | |
|---|---|---|---|
| 3,470,446 | 9/1969 | Berry | 321/15 |
| 3,646,425 | 2/1972 | Beck | 321/15 |

*Primary Examiner*—Howard W. Britton
*Attorney*—Eugene M. Whitacre

[57] ABSTRACT

Peak-to-peak signal detection apparatus adapted for construction in monolithic integrated circuit form. The base-emitter junctions of three like conductivity transistors are direct current coupled in cascade across a source of forward bias voltage (e.g., $3V_{BE}$). Signals to be detected are capacitively coupled to the junction of the base of the second and the emitter of the first transistors. A detector filter capacitor is connected across the base-emitter of the third transistor. Peak-to-peak detected signals are provided at the output of the third transistor.

10 Claims, 1 Drawing Figure

PATENTED OCT 24 1972 3,701,022
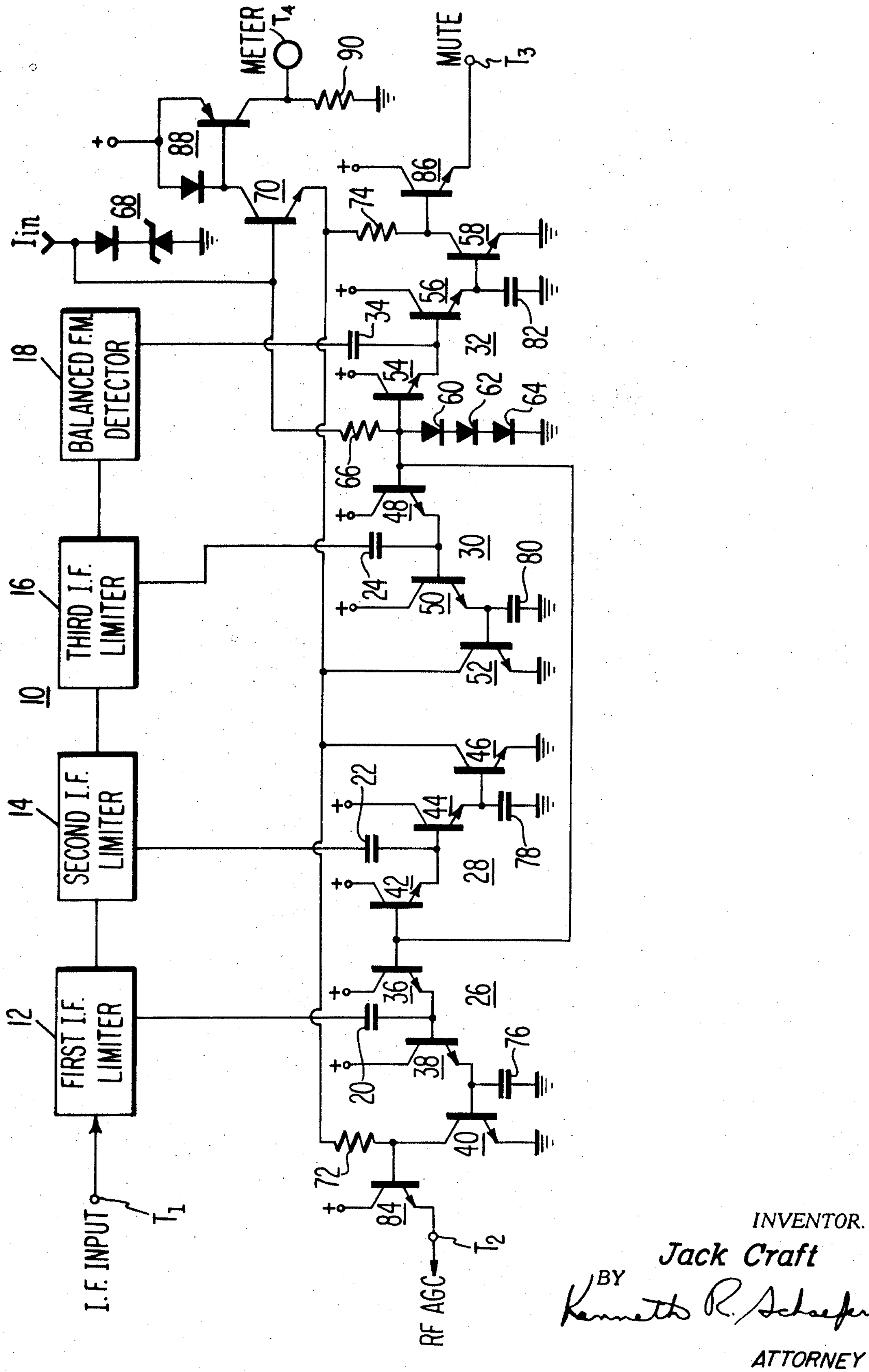
INVENTOR.
Jack Craft
BY Kenneth R. Schaefer
ATTORNEY

PEAK-TO-PEAK DETECTOR

This invention relates to electrical signal detection circuits and, in particular, to apparatus for providing an output representative of peak-to-peak amplitude variations of electrical signals.

The invention is particularly suited for use in monolithic integrated circuits and will therefore be described in such an environment.

Numerous types of electronic circuits for radio signal receivers, such as automatic gain control circuits, signal level meter drive circuits, muting or squelch circuits, etc., involve the use of some means for detecting the amplitude of one or more carrier waves or signals. For example, as is described in U.S. Pat. application Ser. No. 67,010, of myself and Jack Avins, filed Aug. 26, 1970, indications of tuning and signal strength may be provided in a high performance FM radio receiver by detecting the carrier (10.7 MHz) level at the output of each of a plurality of intermediate frequency amplifier stages. Alternatively, as is described in my U.S. Pat. application Ser. No. 67,009, filed Aug. 26, 1970, an electrical signal suitable for muting the output of such an FM radio receiver may be produced by detecting "-holes" in the limited carrier level supplied to the input of an angle modulation detector of the receiver.

In each case, the circuits are adapted for construction in monolithic integrated form. In the design of such circuits, where voltage and current are constrained to moderate levels because of the physical characteristics of the integrated devices, it is desirable to utilize available signal variations to the maximum extent possible. It is therefore desirable, in instances such as those described above, to utilize peak-to-peak amplitude detectors, rather than simple peak detectors, where circuits are fabricated in monolithic integrated form.

In accordance with one aspect of the present invention, an electrical signal detector comprises at least first and second semiconductor rectifying means coupled in cascade relation, baising means coupled to said cascaded rectifying means for forward baising said rectifying means, capacitive input signal supplying means coupled to a junction between said first and second rectifying means for supplying input signals which vary in a positive and a negative sense with respect to a reference level established by said biasing means, and filtering means coupled to said second rectifying means for producing an output signal representative of peak-to-peak variations of said input signal.

A more complete understanding of the present invention may be obtained from the following detailed description taken in conjunction with the accompanying drawing in which a portion of an FM radio receiver, partially in block diagram form and partially in schematic circuit diagram form, including a plurality of signal detection circuits constructed in accordance with the present invention are shown.

Referring to the drawing, the FM radio receiver may be of the general type described in the above-referenced U.S. Pat. application Ser. No. 67,010. In such a receiver, intermediate frequency (I.F.) signals are supplied from a preceding FM tuner arrangement (not shown) to the input terminal $T_1$ of an I.F. amplifier-limiter and FM detector arrangement constructed on a single monolithic silicon chip 10. Input signals are coupled from terminal $T_1$, in turn, to first, second and third I.F. amplifier limiter stages 12, 14 and 16. The amplified output of third amplifier-limiter stage 16 is coupled to an angle modulation detector 18 such as the balanced detector described in U.S. Pat. application Ser. No. 66,945, filed Aug. 26, 1970 in the name of Jack Avins.

Amplified outputs of first, second and third I.F. stages 12, 14 and 16 are coupled, respectively, via capacitors 20, 22 and 24 to first, second and third peak-to-peak detectors 26, 28 and 30. A further amplified and limited I.F. signal is coupled from FM detector circuit 18 (such as from an associated tuned circuit) to a fourth peak-to-peak detector 32 via a capacitor 34. Each of peak detectors 26, 28, 30 and 32 comprises three NPN transistors 36, 38, 40; 42, 44, 46; 50, 52 and 54, 56, 58, respectively, having their base-emitter junctions direct current connected in cascade across a source of forward bias potential ($3V_{BE}$). The forward bias potential is provided by means of three series connected diodes 60, 62, 64, which typically are constructed as transistors having their base and collector electrodes shorted together in the well known manner. A relatively constant current is supplied to diodes 60, 62 and 64 by means of a resistor 66 connected to a compensated zener diode reference voltage supply 68.

The collectors of the first and second transistors 36, 38; 42, 44; 48, 50; and 54, 56 of each detector are connected in common to a main source of operating voltage (B+) indicated by the symbol "+" on the drawing. The collectors of transistors 46 and 52 are each directly connected to the emitter of a transistor 70, the base of which is returned to the zener supply 68. The collector of transistor 40 is coupled via a resistor 72 to the emitter of transistor 70. Similarly, the collector of transistor 58 is coupled via resistor 74 to the emitter of transistor 70. The total collector current of transistor 70 is supplied to a current mirror or inverter 88 which, in turn, is coupled to resistor 90. A tuning meter output terminal $T_4$ is connected to resistor 90. Output transistors 84 and 86 are coupled, respectively, from the collector of transistor 40 to an R-F AGC delay terminal $T_2$ and from the collector of transistor 58 to a muting or squelch output terminal $T_3$. Appropriate filter capacitors (not shown) normally are connected to terminals $T_2$ and $T_3$.

Each of detectors 26, 28, 30 and 32 further includes a detector filter capacitor 76, 78, 80 and 82, respectively connected from the emitter of the second transistors 38, 44, 50, 56 to a point of reference voltage (ground).

In the general operation of the circuit, each of detectors 26, 28, 30 and 32 monitors the level of I.F. signals produced at a particular stage in the I.F. amplifier chain. Each detector 26, 28, 30, 32 is biased to the same level for zero I.F. signal level by means of diodes 60, 62, 64. Detector 32 responds to the lowest level of I.F. input signals supplied to amplifier 12 since the input to detector 32 is preceded by the gain of the entire I.F. amplifier chain. As the input signal level increases, each limiter-amplifier 16, 14, 12, in turn, reaches its limiting condition. Each of detectors 30, 28 and 26 responds, as will appear below, to produce an increased output current. The indication of signal strength and proper tuning produced at output terminal $T_4$ therefore increases as each subsequent detector responds.

The particular operation of one of the peak-to-peak detectors 30 will now be described in detail with the understanding that all function in the same manner. Each of transistors 48, 50 and 52 and diode-connected transistors 60, 62 and 64 preferably are fabricated as substantially identical devices. A bias current is established in diodes 60, 62, 64 by choice of the value of resistor 66 and the zener voltage across supply 68. Appropriate currents flow in transistors 48, 50 and 52 to match the established total voltage drop across diodes 60, 62, 64. It should be recognized that transistor 48 carries the lowest quiescent current of the three transistors 48, 50, 52 since it need only supply base current for transistor 50. Capacitor 24 assumes a quiescent voltage level corresponding to the difference between $2V_{BE}$ (the quiescent voltage at the base of transistor 50) and the quiescent level of the output of third I.F. amplifier-limiter stage 16 (e.g., of the order of $3V_{BE}$).

Upon application of I.F. input signals to terminal $T_1$, the output of third I.F. amplifier-limiter 16 varies above and below its quiescent level at frequencies in the neighborhood of 10.7 MHz. On positive signal excursions above the quiescent reference level, detector transistor 50 conducts, charging filter capacitor 80 approximately to the peak of the input signal level. The resultant voltage across capacitor 80 is of a polarity to cause transistor 52 to increase conduction. As the I.F. signal output of amplifier-limiter 16 swings negative with respect to its quiescent level, the emitter current of transistor 48 increases and charges coupling capacitor 24 so as to clamp the input waveform at the base of transistor 50 to the negative peak of the signal swing. On subsequent positive signal excursions, the filter capacitor 80 will charge to the peak-to-peak signal swing supplied to detector 30. Transistors 48 and 50 conduct alternately on subsequent negative and positive peaks of the input signal variations to charge capacitor 80. Transistor 52 provides a corresponding output current to appropriate utilization circuits.

It should be recognized that all of the components of the illustrated arrangement are readily fabricated in monolithic integrated form. Thus, for example, resistors 66, 72 and 74 may be fabricated to exhibit resistances of 18,000; 5,000 and 5,000 ohms, respectively. Each of capacitors 20, 22, 24, 76, 78 and 80 may be of the order of 2 picofarads while capacitors 34 and 82 may be 7 and 10 picofarads, respectively. In addition, because of the collector-base capacitance of each of the second transistors and the collector-emitter capacitance of each of the first transistors of each detector, the effective signal coupling capacitors typically are increased by approximately an additional 3 picofarads.

It should further be recognized that various modifications may be made with respect to the several aspects of the invention without departing from its full scope. For example, while it is beneficial, for purposes of reducing loading on the reference diode supply, to employ a transistor between such supply and the signal coupling capacitor, it should be recognized that other devices providing the desired rectifying action may also be employed. Similarly, while the output transistor (e.g., 52) of each detector serves to provide a desired current gain in the illustrated embodiment, other output stages may be employed in different applications. The detector filter capacitors 76, 78, 80 and 82 also may be in the form of the collector to base ("Miller") capacitance of the output transistor (e.g., 52) of the detector in the manner set forth in the above-referenced application Ser. No. 67,010.

What is claimed is:

1. A peak-to-peak detector comprising:

a plurality of semiconductor devices, each having at least a rectifying junction, direct current coupled in cascade relation, means coupled to said semiconductor devices for supplying forward bias to said rectifying junctions, means, including at least a first capacitor coupled to the junction of first and second ones of said cascade-coupled devices, for supplying input signals to said devices, and filtering means coupled to said second one of said devices remote from said coupling to said first capacitor for providing an output representative of peak-to-peak variations of said input signals.

2. A peak-to-peak detector in accordance with claim 1 wherein:

said plurality of semiconductor devices comprises first, second and third like conductivity semiconductor junctions poled in the same direction, at least one of said first and second devices comprising a transistor having a base-emitter rectifying junction and a collector coupled to a source of operating voltage.

3. A peak-to-peak detector in accordance with claim 2 wherein:

said third device comprises a transistor having a base-emitter rectifying junction, said emitter being coupled to a reference potential and said collector being coupled to circuit means for utilizing said detected peak-to-peak signal variations.

4. A peak-to-peak detector according to claim 3 wherein:

said means for supplying forward bias comprises a plurality of semiconductor junctions coupled between a source of operating current and said reference potential, said last-named plurality being equal in number to said rectifying junctions.

5. A peak-to-peak detector according to claim 2 wherein:

each of said devices of said plurality comprises a transistor having a base-emitter junction and a collector, said base-emitter junctions being poled in the same direction and direct current coupled to said biasing means, said filtering means comprises a second capacitor coupled to the emitter of said second of said transistors, and said first capacitor is coupled to the base of said second transistor and to the emitter of said first transistor.

6. A peak-to-peak detector according to claim 5 wherein:

said means for supplying forward bias comprises a plurality of semiconductor junctions coupled between a source of operating current and a reference potential, said last-named plurality being equal in number to said transistors and being of like type conductivity as said base-emitter junctions, the emitter of the third of said transistors being coupled to said reference potential.

7. A peak-to-peak detector according to claim 6 wherein:

said second capacitor is returned to said reference potential, the collectors of each of said first and second transistors are coupled to a source of operating potential, and the collector of said third transistor is coupled to circuit means for utilizing the detected peak-to-peak signal variations.

8. A peak-to-peak detector comprising:

first, second and third transistors of like conductivity, each having base, emitter and collector electrodes, the base-emitter junctions of said transistors being direct current coupled in cascade relation, biasing means, including at least first, second and third forward biased semiconductor junctions of the same conductivity as said base-emitter junctions, coupled across said cascaded base-emitter junctions, a source of input signals, a first capacitor coupled from said source to said emitter of said first transistor and to said base of said second transistor, a second capacitor coupled to the emitter of said second transistor, said first and second transistors being alternately responsive to opposite polarity variations of said input signals about a quiescent level for providing output signals at said second capacitor representative of peak-to-peak variations of said input signals.

9. A peak-to-peak detector in accordance with claim 8 wherein:

said second capacitor is connected between said emitter of said second transistor and a point of reference potential, and the emitter of said third transistor and said third semiconductor junction are returned to said point of reference potential.

10. A peak-to-peak detector in accordance with claim 9 wherein:

the collectors of said first and second transistors are connected to a source of operating potential, and the collector of said third transistor is connected to circuit means for utilizing the detected peak-to-peak signal variations.

* * * * *